(12) United States Patent
Allen

(10) Patent No.: US 6,414,404 B1
(45) Date of Patent: Jul. 2, 2002

(54) POWER SWITCHING CIRCUIT

(75) Inventor: Roger M. Allen, Cheadle Heath (GB)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/546,973

(22) Filed: Apr. 11, 2000

(30) Foreign Application Priority Data

Apr. 13, 1999 (GB) .............................................. 9908285

(51) Int. Cl.[7] .............................................. H01H 35/00
(52) U.S. Cl. ...................................... 307/130; 307/131
(58) Field of Search ................................. 307/113, 116, 307/125, 130, 131; 323/220, 223, 225, 282, 285

(56) References Cited

U.S. PATENT DOCUMENTS

| | | | |
|---|---|---|---|
| 4,929,884 A | | 5/1990 | Bird et al. .................... 323/313 |
| 5,079,498 A | * | 1/1992 | Cleasby et al. .............. 323/283 |
| 5,081,379 A | | 1/1992 | Korteling ..................... 307/530 |
| 5,814,903 A | * | 9/1998 | Wu .............................. 307/125 |
| 6,225,797 B1 | * | 5/2001 | Willis et al. ................. 323/351 |

FOREIGN PATENT DOCUMENTS

| | | |
|---|---|---|
| EP | 0139998 A1 | 5/1985 |
| WO | 9949377 A1 | 9/1999 ........... G05F/1/575 |

* cited by examiner

Primary Examiner—Matthew Nguyen
(74) Attorney, Agent, or Firm—Steven R. Biren

(57) ABSTRACT

A power switching circuit has: first and second voltage supply lines (2 and 3); a control signal input terminal (I); a load terminal (LT); and a measurement terminal (MT). A power semiconductor switch (M) has a main current carrying section (MC1 and MC2) and a sense current carrying section (SC1 and SC2) for carrying a current which is proportional to and smaller than the current carried by the main current carrying section. The main current carrying section is formed of a plurality of subsidiary current carrying sections (MC1 and MC2). Each subsidiary current carrying section has a subsidiary main current carrying electrode (S1 and S2) coupled to the load terminal (LT) so that the subsidiary electrodes together form the main current carrying electrode. Each subsidiary main current carrying section has a respective different control electrode (G1 and G2). A control circuit (7) is provided for sensing the voltage at the load terminal (LT) and for separately controlling the supply of a control signal from the control signal input terminal (I) to each of the control electrodes (G1 and G2) in dependence upon the sensed voltage.

20 Claims, 6 Drawing Sheets

POWER SWITCHING CIRCUIT

BACKGROUND OF THE INVENTION

This invention relates to a power switching circuit having a power semiconductor switch, which circuit has particular, but not exclusive, application in the automotive industry.

The power semiconductor switch of such a power switching circuit comprises a plurality of parallel-connected active cells, source cells where the power semiconductor switch is a power MOSFET or an insulated gate bipolar transistor (IGBT).

As disclosed in, for example, EP-A-0 139 998 it is known to separate the active cells into a main current carrying section containing the majority of the active cells and a sense or emulation current carrying section containing only a few of the active cells by, in the case of a power MOSFET or IGBT, providing separate connections to the sources of the active cells of the main current carrying section and of the sense current carrying section. As disclosed in EP-A-0 139 998, the current flowing through the main current carrying section should be related to that flowing through the sense current carrying section by a constant K given by the ratio of the active areas of the main current carrying and sense current carrying sections, that is the ratio between the number of active cells in these two sections when all the active cells are identical. Therefore sensing the current flowing through the current carrying section should enable a determination to be made as to the current flowing through the main current carrying section of the device. This enables, for example, detection of faults in the power semiconductor switch itself or the detection of, for example, a short or open circuit when the load which the power switch is arranged to switch is defective.

However, under certain circumstances, for example change in the input impedance of the circuit used to sense the current flowing through the sense current carrying section or in the input impedance of the load connected to the semiconductor power switch, the current flowing through the sense current carrying section may not be proportional to that flowing through the main current carrying section. U.S. Pat. No. 5,081,379 addresses this problem by providing a voltage impression device which impresses the voltage of the source electrode (in the case of a power MOSFET or IGBT) of the main current carrying section on the source electrode of the sense current carrying section.

As disclosed in U.S. Pat. No. 5,081,379, the voltage impression device comprises a differential amplifier having its non-inverting input connected to the source electrode of the main current carrying section and its inverting input connected to the source electrode of the sense current carrying section. The output of the differential amplifier is connected to the control electrode of control transistor (a p-channel IGFET (insulated gate field effect transistor) in the example given where the power switch is an n-channel power MOSFET)) having its source electrode connected to the source electrode of the sense current carrying section of the power semiconductor switch.

Even in the power switching circuit disclosed in U.S. Pat. No. 5,081,379 the current flowing through the main current carrying section is not exactly related to measured current by the factor K, rather the current through the main current carrying section is related to the measured current by:

$$K.(1-Voff/Vbl)$$

where Voff is the input offset voltage of the differential amplifier and Vbl is the voltage at the load with respect to the positive supply voltage where the power semiconductor switch is a high side switch for connecting a load to a positive voltage supply line (such as the positive terminal of the battery where the power switching circuit is used in an automotive application).

At high current levels Vbl is significantly bigger than Voff and so the error, Voff/Vbl, in the measure of the current through the load obtained by sensing the current through the sense current carrying section is small. However, at low current levels, the amplifier input offset voltage Voff presents a significant part of the load voltage and gives rise to a significant error. Previously, this problem has been addressed by increasing the load voltage by reducing the voltage applied to the control electrode of the power semiconductor switch relative to the load voltage Vbl, thereby increasing the on-resistance of the power switch. The problem with this approach is that reducing the drive voltage to the control electrode in order to increase the on-resistance of the power semiconductor switch takes the power switch out of its linear operation region so that the relationship between the sensed current and that flowing through the main current carrying section becomes dependent on the difference between the control electrode and offset voltage squared resulting in the current through the main current carrying sections being related to the measured current by:

$$K.(Vgs-Vt-Voff)^2/(Vgs-Vt)^2$$

where Vt is the threshold voltage of the power switch and Vgs is the voltage between the control and source electrodes of the main and sense current carrying sections. As can be seen from a comparison of equations 1 and 2, this approach results in the offset voltage having an even more significant effect giving rise to an even greater error as the sense error has terms proportional to $V_{off}$ and $V_{off}$ squared.

Such problems may be reduced, but not eliminated, by using a high precision operational amplifier with an extremely low offset voltage. This would, however, significantly increase the cost of the power switching circuit.

SUMMARY OF THE INVENTION

It is an aim of the present invention to provide a power switching circuit which enables errors in the measure of the current through the main current carrying section arising from the voltage offset of the amplifier to be avoided or at least reduced without the necessity for using an extremely high precision operational amplifier.

In one aspect, the present invention provides a power switching circuit comprising a power semiconductor switch, which may be intended to operate as a high-side switch, having a main current carrying section and a sense current carrying section for carrying a smaller current than the main current carrying section, the first and second current carrying sections sharing a common first main electrode, the main current carrying section having a main current carrying electrode for connection to a load and the sense current carrying section having a sense current carrying electrode for enabling the current through the sense current carrying section to be measured, wherein at least the main current carrying section is formed of a plurality of subsidiary current carrying sections, means are provided for sensing the voltage at the main current carrying electrode and for switching off or reducing the current through at least one of the plurality of subsidiary current carrying sections of the main current carrying section when the voltage at the main current carrying electrode drops below a predetermined value so as thereby to increase the resistance through the power semiconductor switch device while maintaining the power semiconductor switch in its linear operation region.

According to one aspect of the present invention, there is provided a power switching circuit as set out in claim 1.

This enables accurate measurement of the current flow through the power semiconductor switch at low current levels by increasing the on-resistance in a manner which allows the power semiconductor switch device to remain in its linear operation region.

Various preferred features in accordance with the invention are set out in claims 1 to 15.

BRIEF DESCRIPTION OF THE DRAWINGS

These and other advantageous features in accordance with the invention will now be illustrated in embodiments of the present invention, now to be described with reference to the accompanying drawings, in which.

Figure 1:
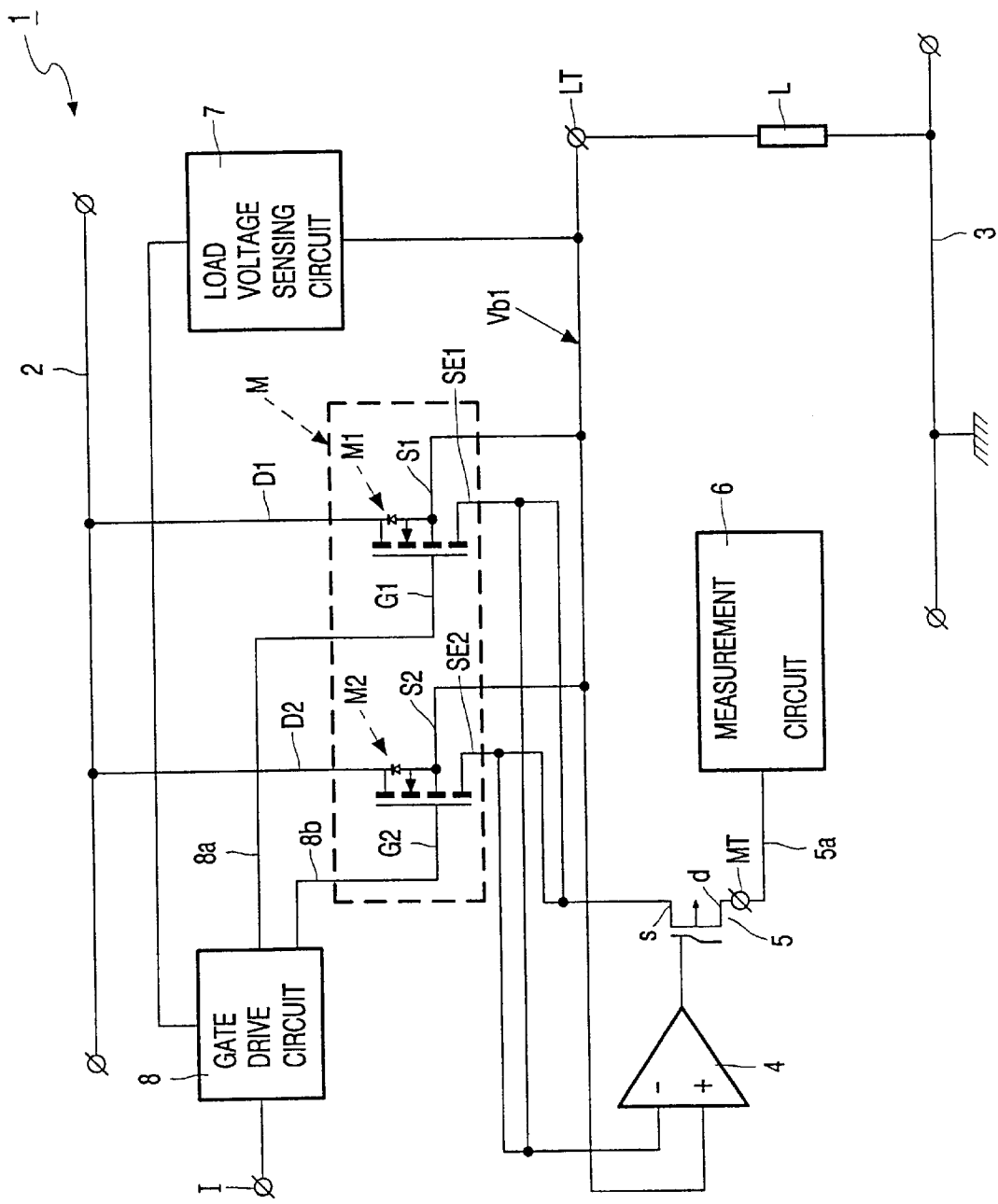
FIG. 1 shows a partly block-schematic circuit diagram of a first embodiment of a power switching circuit in accordance with the present invention.

It should be noted that the figures are diagrammatic and are not drawn to scale. In particular, in FIGS. 6 to 8, relative dimensions and proportions of parts of the drawings have been shown exaggerated or reduced in size, for the sake of clarity and convenience in the drawings. The same reference signs are generally used to refer to corresponding or similar features throughout the drawings.

DESCRIPTION OF THE PREFERRED EMBODIMENTS

FIG. 1 shows a partly block-schematic circuit diagram of a first embodiment of a power switching circuit 1 in accordance with the present invention.

The power switching circuit 1 comprises a power semiconductor switch in the form of an n-channel enhancement mode power vertical MOSFET having, as is known in the art, many tens of thousands of parallel-connected source cells sharing a common drain region. The power MOSFET M is arranged to be coupled as a high-side switch that is, with its drain electrodes D1, D2, coupled to a positive voltage supply line 2. The source electrodes S1, S2 (collectively referred to as "S" herein) of MOSFET M is coupled to a load terminal LT to which a load L is connectable between an earth or ground voltage supply line 3 and the positive voltage supply line 2 via the power MOSFET M.

The gate or control electrodes G1, G2 of the power MOSFET M is coupled to a control input line 1 via a gate drive circuit 8.

As is known, for example, from EP-A-0 139 998, the power switching device is separated into a main current carrying section and a sense current carrying section by patterning the source metallisation. This patterning causes a number of the source cells to be isolated from the main source electrodes S1, S2 and connected to a separate sensing electrode SE1, SE2 (collectively referred to as "SE" herein).

Theoretically, the current through the main current carrying section should be related to the current through the sense current carrying section multiplied by the ratio of the number of source cells in the main current carrying section divided by the number of source cells in the sense current carrying section. This, however, is only the case if the voltages at the source electrode S and sense electrodes SE are the same. In order to achieve this, as disclosed in U.S. Pat. No. 5,081,379 discussed above, a voltage impression device is used to impress the voltage at the source electrode S onto the sense electrode SE. As shown in FIG. 1, the voltage impression device comprises a differential amplifier 4 having its inverting input connected to the sense electrode SE and its non-inverting input connected to the source electrode S. The output of the differential amplifier 4 is connected to the control electrode of a control transistor 5 of the voltage impression device. In the example shown, the control transistor 5 is a p-channel enhancement mode insulated gate field effect transistor having its source electrode connected to the sense electrode SE and its drain electrode connected at a measurement terminal MT to a measurement circuit 6 for measuring the current flowing through the sense electrode. The differential amplifier 4 and the control transistor 5 may be integrated into the same semiconductor body as the power semiconductor switch M as will be detailed below.

To facilitate differentiation, power insulated gate field effect transistors are referred to herein as MOSFETs while logic insulated gate field effect transistors are referred to herein as IGFETs.

As described above, the power switching circuit 1 shown in FIG. 1 is the same as that disclosed in U.S. Pat. No. 5,081,379 with the voltage impression device 4, 5 serving to impress the source electrode voltage onto the sense electrode voltage so that the current through the sense current carrying section is proportional to the current flowing through the main current carrying section.

In contrast to the arrangement shown in U.S. Pat. No. 5,081,379, the main current carrying section and the sense current carrying section of the power semiconductor switch M shown in FIG. 1 are split into a number of subsidiary sections as will be described below. In the arrangement shown in FIG. 1, the power semiconductor switch M has two subsidiary main current carrying sections, each having a corresponding sense current carrying section, illustrated schematically as two parallel-connected MOSFETs M1 and M2. The drain electrodes D1 and D2 of the two MOSFETs M1 and M2 are connected to the power supply line 2, the source electrodes S1 and S2 are connected to the load terminal LT and to the non-inverting input of the differential amplifier 4, and the two sense electrodes SE1 and SE2 are connected to the inverting input of the differential amplifier 4 and to the source electrode of the p-channel IGFET 5. As shown in FIG. 1, separate gate or control electrodes G1 and G2 are provided for the MOSFETs M1 and M2.

A load voltage sensing circuit 7 is provided to sense the voltage Vbl at the load terminal LT with respect to the positive supply voltage, that is the voltage at the source electrodes S1 and S2. The load voltage sensing circuit 7 controls the gate drive circuit 8 which has first and second outputs 8a and 8b connected to the control electrodes G1 and G2, respectively.

As set out above, the ratio between the measured current and the current through the main current carrying section is given by:

$$K \times (1 - Voff/Vbl)$$

where Voff is the input offset voltage of the differential amplifier 4, Vbl is the load voltage and K is the geometric area ratio of the sense to main current carrying sections. Because the source cells are all of the same size, the ratio relates to the number of these source cells.

In operation of the circuit shown in FIG. 1, when the load voltage sensing circuit 7 determines that the load voltage Vbl has become so low that the input offset voltage Voff of the differential amplifier 4 has a significant effect on the current ratio, the load voltage sensing circuit 7 causes the gate drive circuit 8 to switch off or reduce the gate drive voltage to one of the control electrodes G1 and G2 of the power semiconductor switch M so as to leave only one of the MOSFETs M1 and M2 conducting. As will be appreciated by the person skilled in the art, because a MOSFET with a smaller number of source cells is now conducting, the on-resistance of the power semiconductor switch will increase, raising the voltage Vbl at the load terminal LT, and thereby reducing the effect of the differential amplifier 4 offset voltage on the [current ratio, while still allowing the power semiconductor switch M to operate in its linear region.

Typically, the load voltage sensing circuit 7 may be arranged to cause the gate drive circuit 8 to switch off or reduce the drive voltage to one of the MOSFETs Ml and M2 when the voltage at the load terminal LT is of the order of only about ten times the input offset voltage Voff of the differential amplifier 4.

Figure 2:
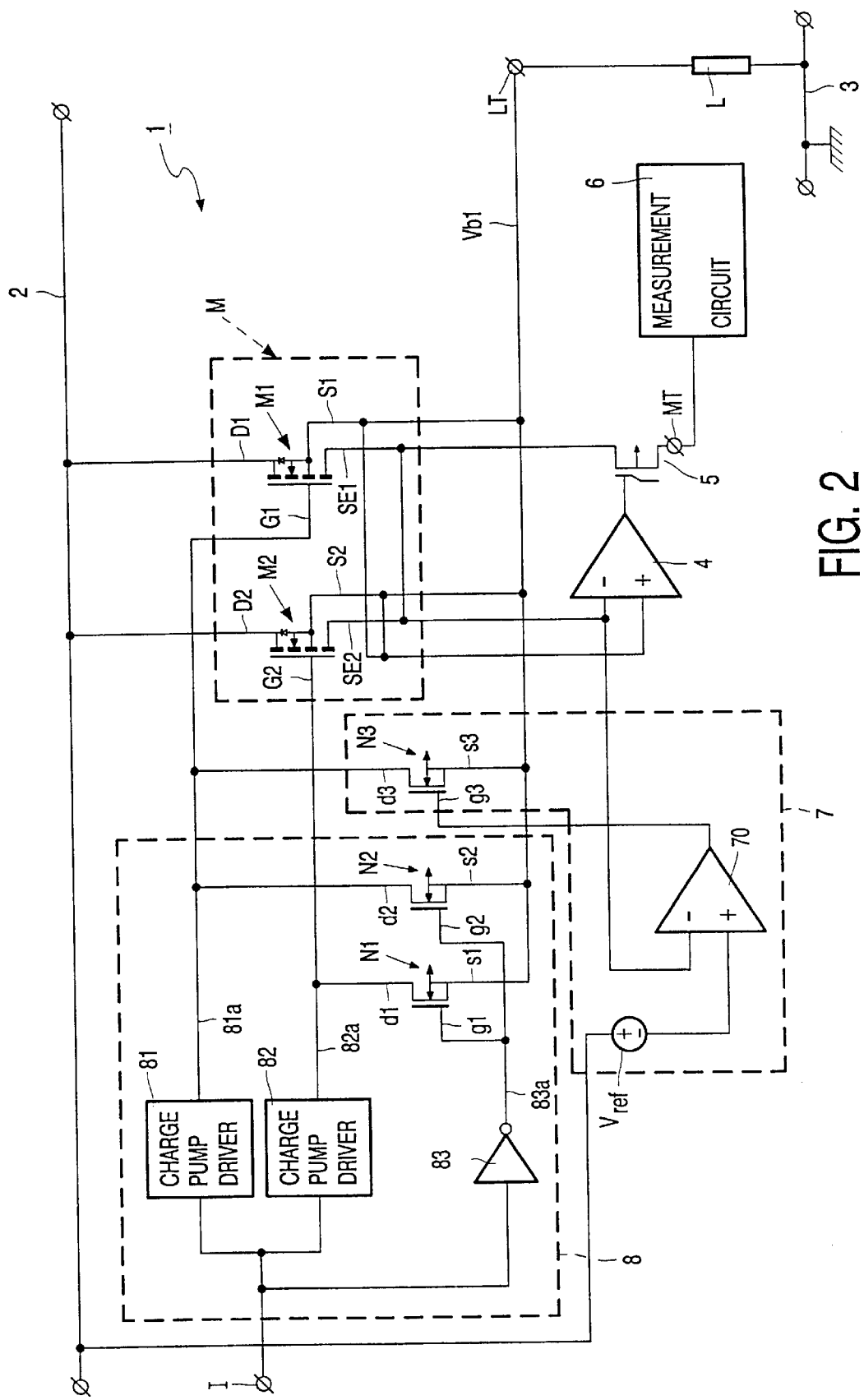
FIG. 2 shows a partly block-schematic circuit diagram of a second embodiment of a power switching circuit in accordance with the present invention.

FIG. 2 shows another embodiment of a power switching circuit in accordance with the invention. The power semiconductor switch M, differential amplifier 4, control transistor 5 and measurement circuit 6 shown in FIG. 2 are equivalent components to those shown in FIG. 1 and will not be described again.

In the circuit shown in FIG. 2, the input control signal line 1 is coupled via a charge pump driver 81 and line 81a to the control gate G1 and via a charge pump driver 82 and line 82a to the control gate G2. The charge pump drivers may be of any known form and, as will be understood by the person skilled in the art, derive sufficient voltage to turn on the MOSFETs M1 and M2 from the input signal control line 1. The gate drive circuit 8 also comprises two n-channel enhancement mode IGFETs N1 and N2 each having their control gate G1 and G2 coupled to the input control signal line 1 via an inverter 83 and line 83a so that the IGFETs N1 and N2 are rendered conducting when the signal on the input signal control; line 1 is low and vice versa.

The source electrode s1 of IGFET N1 is coupled to the source electrode S1 of the power semiconductor switch M while the source electrode s1 of the IGFET N2 is coupled to the source electrode S2 of the power semiconductor switch M. The drain electrode d1 of the IGFET N1 is coupled to the control gate G2. The drain electrode d2 of the IGFET N2 is coupled to the control gate G1 of the power semiconductor switch M The IGFETs N1 and N2 form control transistors for removing the gate drive from the control gates G1 and G2 and thus turning off the power semiconductor switch M when a turn-off signal is applied to the control input line 1.

As shown in FIG. 2, the load voltage sensing circuit 7 comprises a comparator 70 and a third n-channel enhancement mode IGFET N3 having its drain electrode d3 coupled to one of the control gates G1 and G2 of the power semiconductor switch M1, in this case coupled to the control gate G1. The source electrode s3 of the third IGFET N3 is coupled to the source electrodes S1 and S2 of the power semiconductor switch M1. The sense electrodes SE1 and SE2 of the power semiconductor switch M are coupled to the inverting input of the comparator 70. The non-inverting input of the comparator 70 is coupled to a reference voltage Vref, and its output is coupled to the control gate g3 of the third IGFET N3.

In operation of the circuit shown in FIG. 2, when the voltage at the load terminal LT and thus the voltage at the sense electrodes SE1 and SE2 falls to Vref, the output of the comparator 70 goes high, turning on the third n-channel IGFET N3 and so pulling down the control gate G1. This voltage drop renders the power MOSFET M1 non-conducting, thus reducing the number of source cells and increasing the on-resistance of the power semiconductor switch M. Typically, the on-resistance of the power semiconductor switch M will be 30 m Ohm (milliohms) when both MOSFETs M1 and M2 are conducting and 300 m Ohm when only MOSFET M2 is conducting.

Where the offset voltage of the comparator 70 is 5 millivolts (mV), then Vref will generally be 50 millivolts. Any known reference voltage source may be used, for example a bandgap reference voltage source.

The use of the comparator 70 shown in FIG. 2 provides for a sharp transition in the on-resistance of the power semiconductor switch M. This is illustrated by the solid line A in the graph of load voltage Vbl (in volts) against current IL (in amps) shown in FIG. 4. As can be seen from FIG. 4, when the load voltage Vbl falls to the reference voltage Vref, the third IGFET N3 is rendered conducting and switches off the power MOSFET M1, immediately increasing the on-resistance of the power semiconductor switch M. The immediate increase of the on-resistence of the power semiconductor switch M causes a rapid increase in the load voltage Vbl bringing the load voltage up to point A1 in FIG. 4 for the same load current IL. The comparator 70 is provided with hysteresis in known manner so that, as can be seen from FIG. 4, the power MOSFET M1 is not rendered conducting again until the load voltage Vbl reaches V1 which is, in this embodiment, at least 450 mV (millivolts) greater than Vref. In this example V1 is 600 mV greater than Vref.

Figure 4:
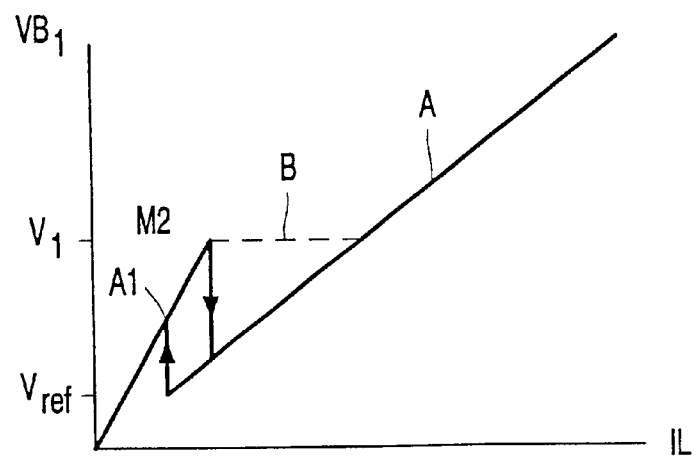
FIG. 4 is a graph showing the load terminal voltage (Vbl) in volts of the circuit shown in FIG. 1 or 2 against the load current (IL)

The comparator 70 shown in FIG. 2 may be replaced by an operational amplifier which, as indicated by the dashed line B in FIG. 4, does not immediately pull down the gate G1 of the power MOSFET M1 so as to switch MOSFET M1 off when the reference voltage Vref is reached. The effect instead is to gradually render the IGFET N3 conducting and so gradually reduce the drive to the gate G1 so as to switch the power MOSFET M1 off gradually. This has the advantage of providing a smooth switch-over transition with no step in the load voltage. Use of a comparator does, however, have the advantage of requiring less semiconductor area than operational amplifiers.

Figure 3:
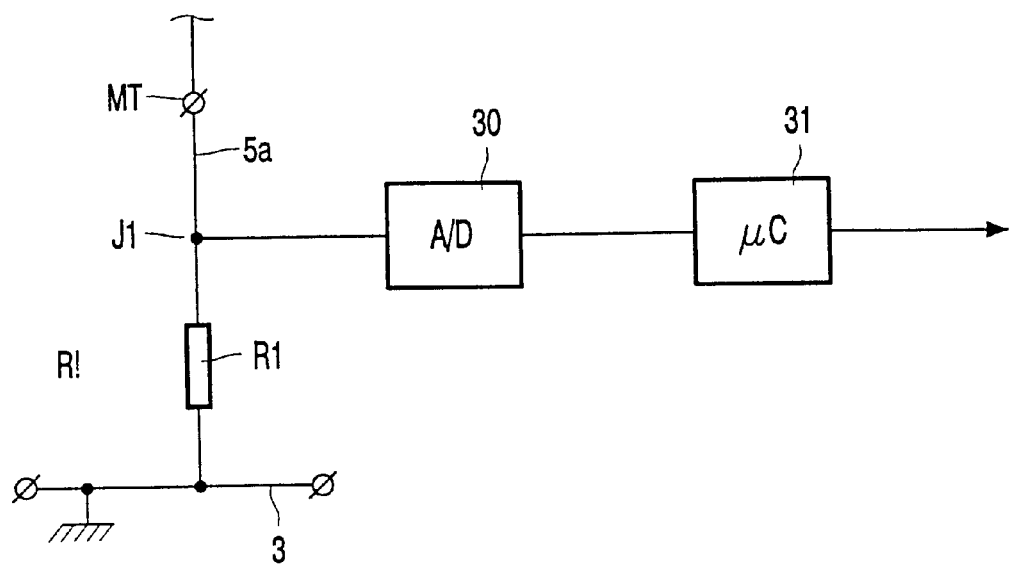
FIG. 3 shows an example of a measurement circuit suitable for use in the power switching circuit shown in FIG. 1 or FIG. 2.

The measurement circuit shown in FIGS. 1 and 2 may be any suitable known measurement circuit. FIG. 3 shows block schematically an example of a typical measurement circuit. In the circuit shown in FIG. 3, the measurement terminal MT is coupled by a line 5a to a high resistance resistor R1 which is itself coupled to the earth or ground voltage supply line 3. The junction J1 is coupled to an analogue-to-digital (A/D) converter 30 that converts the analogue voltage at junction J1 into a digital signal which is then supplied to a microcontroller 31 which monitors the load current and supplies an output signal that may be used in known manner to, for example, control operation of the power switch or to supply an error or alarm signal. As another example, a current level detection circuit may be used as disclosed in U.S. Pat. No. 5,081,379.

Figure 5:
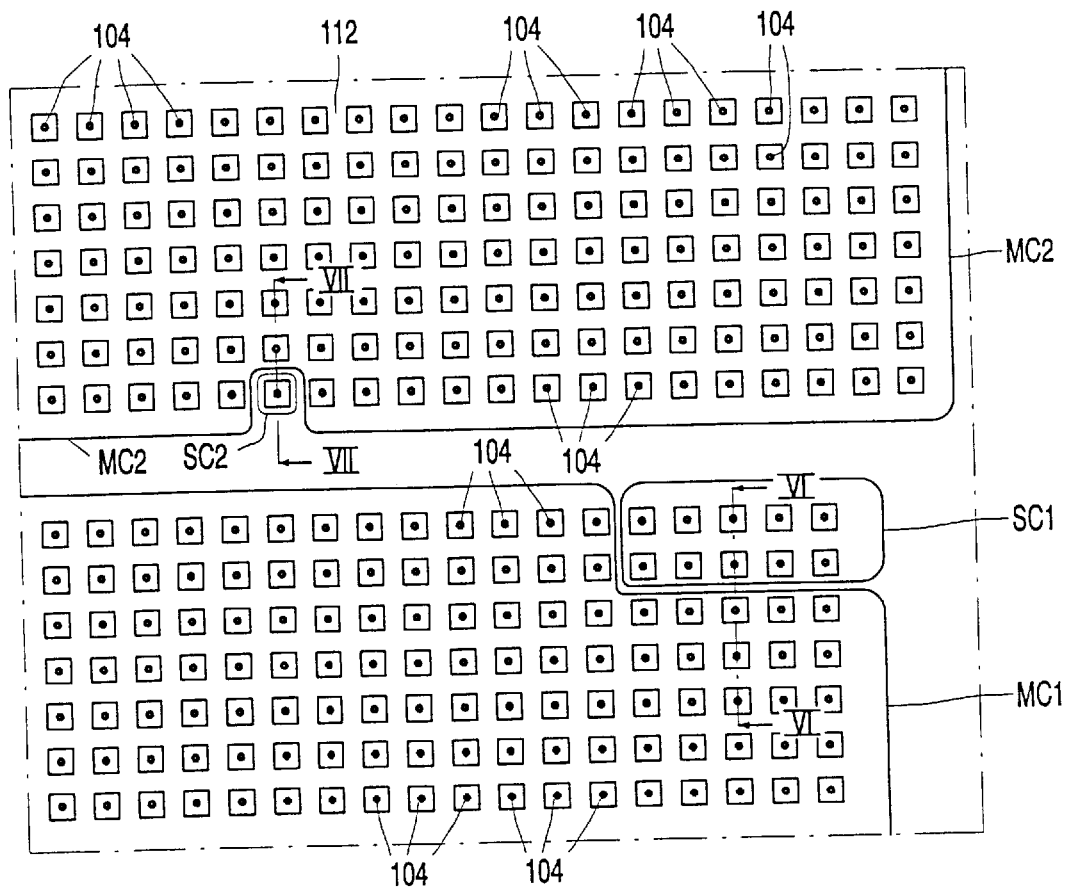
FIG. 5 shows a top plan view of part of a power semiconductor switch for use in the circuit shown in FIG. 1 or 2 with certain surface layers omitted for illustrative purposes.
Figure 6:
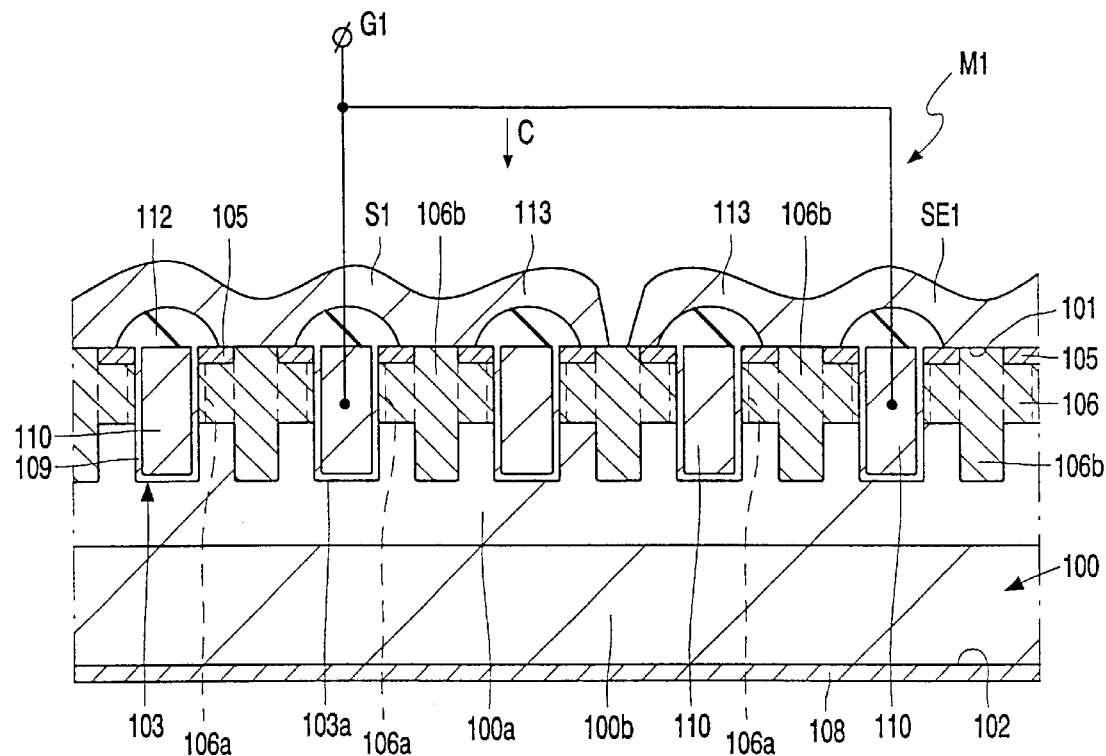
FIGS. 6 and 7 show cross-sectional views taken along lines VI—VI and VII—VII, respectively, in FIG. 5.
Figure 7:
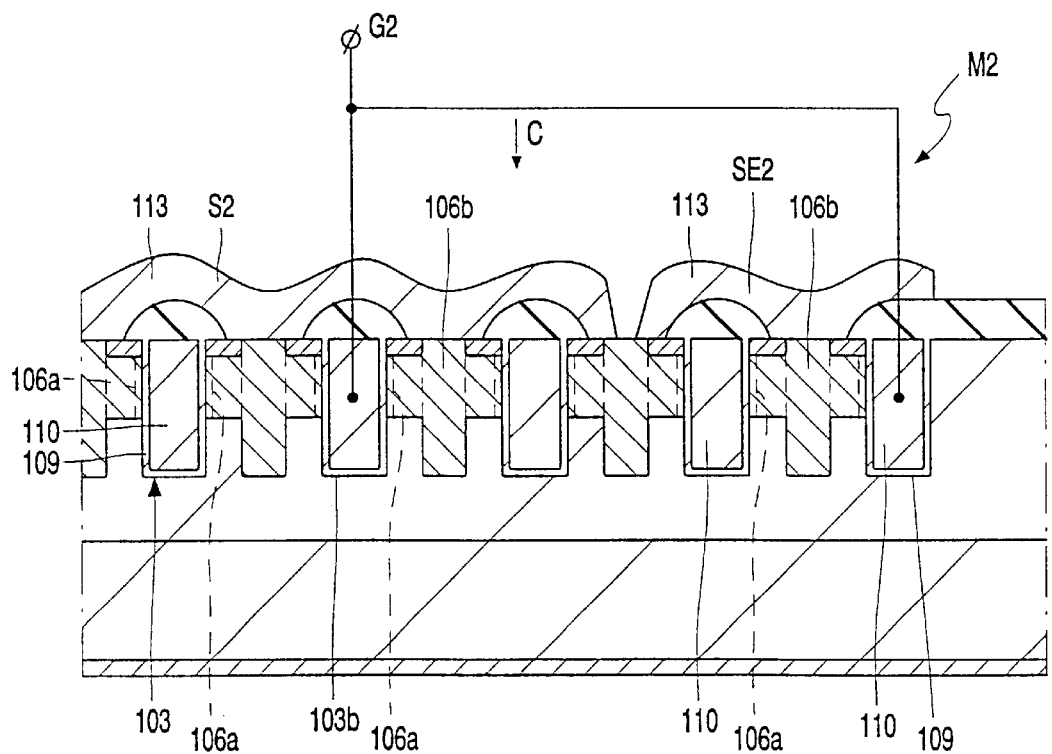

The power semiconductor switch M (see FIG. 2) is, as described above, an n-channel enhancement mode MOS-FET. FIGS. 5 to 7 illustrate the MOSFET M in more detail. In particular, FIGS. 6 and 7 are cross-sectional views through part of the power semiconductor switch M while FIG. 5 shows a top plan view looking in the direction of arrow C in FIGS. 6 and 7 but with the top metallisation (source and gate metallisation) omitted.

As shown in FIGS. 6 and 7, the power semiconductor switch M comprises a monocrystalline silicon semiconductor body 100 having first and second opposed major surfaces 101 and 102. A trench 103 extends into the first major surface 101 so as to define at the first major surface a regular array of polygonal source cells 104 (FIG. 5) each bounded by the trench 103 as shown in FIG. 5. Typically the device will consist of many tens of thousands of identical source cells.

Each polygonal source cell 104 contains a source region 105 of one conductivity type, in this example n-conductivity type, and a body region 106 of the opposite conductivity type, in this example p-conductivity type the body region 106 separates the source regions 105 from a common further region 100a of the one conductivity type so as to define a respective conduction channel area or channel accommodating portion 106a, extending between each source region 105 and the common further region 100a. Each polygonal source cell 104 may contain, as shown in FIGS. 6 and 7, a central region 160b of the same conductivity type as the body region 106 but more highly doped so as to move the point of avalanche breakdown away from the corners of the trench and so as to control the hole current conduction path through the power MOSFET, thereby improving the ruggedness of the power MOSFET.

A drain electrode 108 makes ohmic contact to a more highly doped region 100b of the one conductivity type upon which the common further region 100a is formed. The common further region 100a thus forms the drain drift region, and the highly doped region 100b forms the drain region of the power semiconductor switch M.

A gate dielectric layer 109 in the trench 103 separates a gate conductive layer 110, which may be formed of doped polycrystalline silicon, from the semiconductor body so as to form an insulated gate structure. Insulating regions 112, generally of silicon dioxide, are formed over the gate structure 109, 110 to enable isolation from subsequent source metallisation 113. By patterning of the insulating regions 112 and the metallisation, the same metallisation layer is also used to enable a gate electrode (not shown in FIGS. 6 and 7) to make contact to the conductive layer 110 of the insulated gate structure 109, 110.

The power semiconductor switch M is separated into the two MOSFETs M1 and M2 by separating the trench 103 into two isolated trench portions 103a and 103b to provide two separate gates 109, 110 for the MOSFETs M1 and M2. The two MOSFETs M1 and M2 are in turn separated into the main and sense current carrying sections MC1 and MC2 and SC1 and SC2 by patterning of the source metallisation 113 as shown in FIG. 5. The metallisation making contact to the two separate gates 109, 110 is, of course, also patterned to define the two separate gate electrodes G1 and G2. The peripheries of the source and sense metallisation electrodes S1, S2, SE1 and SE2 are shown in FIG. 5 so as to illustrate the separation of the power semiconductor switch into the different current carrying sections.

In the embodiments shown in FIGS. 1 and 2, the MOSFET M1 consists of 50,000 cells while the MOSFET M2 consists of 5,000 cells. The main current carrying section MC1 of the MOSFET M1 has 49,990 source cells (only a few of which are shown in FIG. 5) while the sense current carrying section SC1 of the MOSFET M1 has 10 source cells. The MOSFET M2 is smaller, with the main and sense current carrying sections MC2 and SC2 having 4,999 (only a few are shown in FIG. 5) and one source cell, respectively. It will be appreciated that the ratio of the number of main current carrying source cells to sense current carrying source cells in each of the MOSFETs M1 and M2 should be the same but the ratio between the number of source cells in the main current carrying sections MC1 and MC2 may be adjusted so as to achieve a particular increase in on-resistance when the MOSFET M1 is switched off as discussed above.

The circuits shown in FIGS. 1 and 2 use the power semiconductor switch M as a high-side switch, that is, the switch M is provided between the positive voltage supply line 2 and the load terminal LT.

In the interest of cost and of compactness, it is desirable for all of the elements (excluding the load L which forms part of the circuit only in use) shown in the circuit of FIG. 1 or the circuit of FIG. 2 to be integrated into a single semiconductor chip. As explained in U.S. Pat. No. 5,081,379, especially for automotive applications, the voltage between the power supply lines 2 and 3 may be of the order of 50 to 60 volts. Low power logic transistor N1 to N3 such as IGFETs and the like may be integrated into the same semiconductor body as the power semiconductor switch M by providing complex structural arrangements which isolate the low power logic circuitry from the high side power semiconductor switch M. The integration involves the provision of special diffusions or barrier layers of differing conductivity types to interpose high breakdown voltage reverse bias pn-junctions between the substrate 100b to which the high voltage is applied and the low power logic devices, or by the provision of dielectric isolation. Such expensive, technically complex techniques can, however, be avoided by, as described in U.S. Pat. No. 4,929,884, operating the logic devices, with respect to the positive power supply line 2 (that is high side) rather than the earth or ground power supply line 3.

As will be appreciated by those skilled in the art, where the power semiconductor switch M is a high-side switch and is to be used in applications where there is no voltage available above the drain voltage on the voltage supply line 2, then, as shown in FIG. 2, the gate drive circuit will, as is known in the art, include charge pumps for enabling the required gate voltages to be achieved at the gates G1 and G2. Such charge pump drivers would not be necessary if a voltage source sufficient to turn on the power MOSFETs M1 and M2 was available.

Where as described in U.S. Pat. No. 4,929,884, the power switching circuit incorporates high-side logic circuitry, then the gate drive circuit will normally include a level shifter to enable the required gate voltages to be achieved. Again, appropriate level shifters are known in the art.

Figure 8:
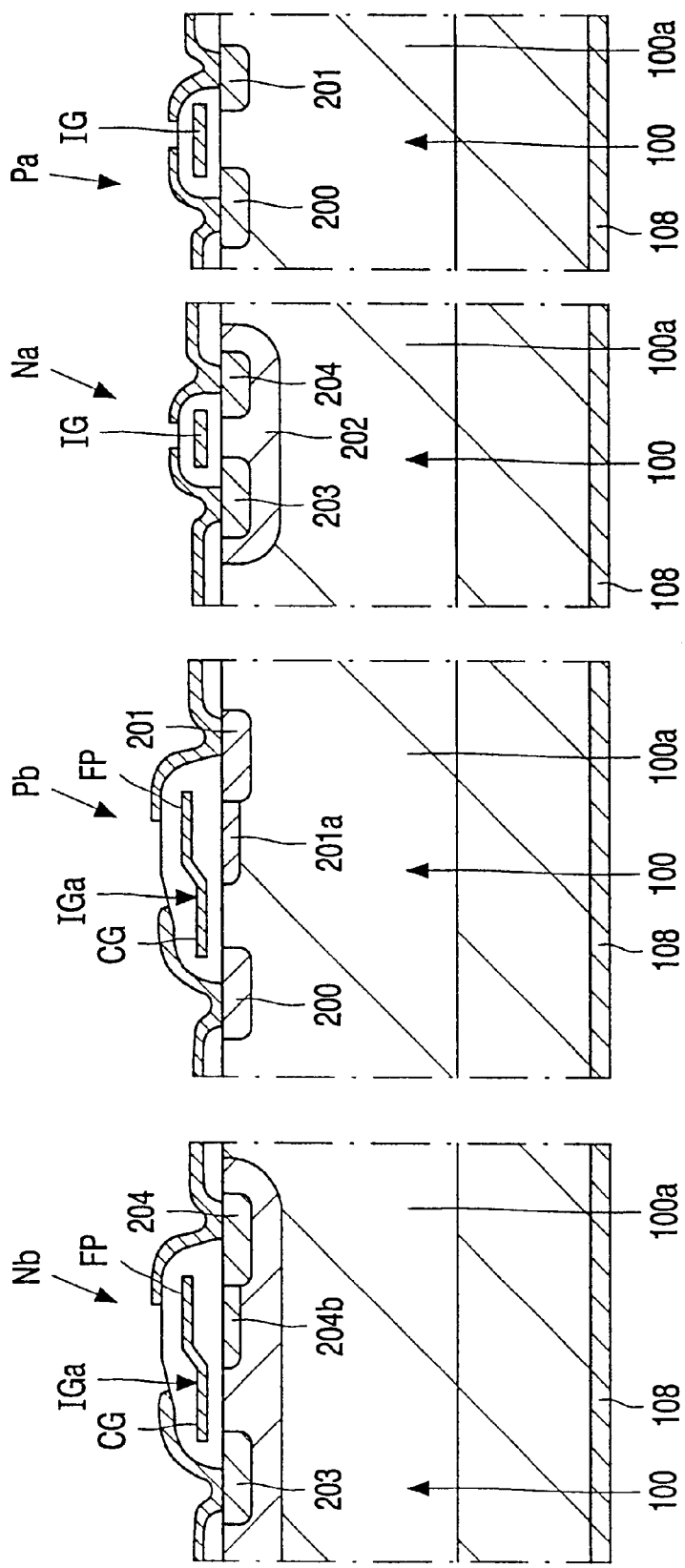
FIG. 8 shows a fragmentary cross-sectional view, similar to that shown in FIGS. 6 and 7, through part of a semiconductor body to show the structure of logic transistors integrated with the power semiconductor switch shown in FIGS. 5 to 7.

FIG. 8 illustrates part of the semiconductor body 100 showing the structures which may be used to form two different types of n- and p-channel enhancement mode lateral IGFETs in the same semiconductor body 100 as the power semiconductor switch M when the logic is operated from the positive power supply line 2. The first p-channel IGFET Pa shown in FIG. 8 has p-conductivity type source and drain regions 200 and 201 formed directly into the common further region 100a which forms a conduction channel region beneath an insulated gate electrode IG. The first n-channel IGFET Na shown in FIG. 8 has a p-conductivity type well 202 within which are formed n-conductivity type source and drain regions 203 and 204 separated by a conduction channel region defined by the p-well 202 and having an insulated gate IG overlying the conduction channel region. The second n- and p-channel IGFETs Nb and Pb shown in FIG. 8 differ from the first n- and p-channel IGFETs in that they are designed to be able to withstand higher voltages. To this end, the drain regions 201 and 204 of the second p- and n-channel IGFETs Pb and Nb each have a less doped drain extension region 201a and 204b over which the insulated gate IGa extends. As can be seen from FIG. 8, the gate dielectric layer beneath the drain drift regions 201a and 204b is of increased thickness. This structure ensures that the source and conducting channel regions only see low fields because high lateral voltages are dropped across the lowly doped drain extension regions 201a and 204b. The conductive gate CG extends up onto the step in the gate dielectric over the drain extension regions 201a and 204b so as to act as a field plate FP helping to extend the low field beyond the step in the gate dielectric.

As will be appreciated by those skilled in the art, the control transistor 5 shown in FIGS. 1 and 2 may experience high voltages. Accordingly, this p-channel IGFET (and any other similar p-channel IGFETs) have the structure of the p-channel IGFET Pb shown in FIG. 8.

The source cells of the power semiconductor switch shown in FIG. 5 are square (with rounded corners) and arranged in a square array. It will, however, be appreciated that other known source cell geometries may be used and that, for example, the source cells may be hexagonal and arranged in a hexagonal close-packed array.

In the embodiments described above, the power semiconductor switch M is a vertical trench MOSFET. However, the power semiconductor switch could also be a power DMOSFET (double diffused MOSFET) as is known in the art and is illustrated in FIG. 2B of U.S. Pat. No. 4,929,884, for example.

The present invention could be applied to applications where the power semiconductor switch is other than a power MOSFET. For example, the power semiconductor switch could be an insulated gate bipolar transistor (IGBT) having the structure shown in FIGS. 5 to 7 but with the highly doped one conductivity type substrate 100b being replaced by a highly doped substrate of the opposite conductivity type or being formed with highly doped localized regions of the opposite conductivity type extending through the substrate (a so-called anode-shorted IGBT).

In the arrangements described above, the power semiconductor switch is an insulated gate field effect device. However, other field effect power semiconductor devices may be used. For example, the insulated gate may be replaced by so-called Schottky gate technologies in which the gate dielectric layer is omitted and the conductive gate layer forms a Schottky barrier with the lowly doped conduction channel area or accommodating portion. Also, the source regions could be formed as Schottky contact regions rather than diffused regions.

Also, in the embodiments described above, the power semiconductor switch M is a high-side switch. The present invention may, however, also be applied where the power semiconductor switch is a low side switch. This may be achieved by, for example, effectively inverting the circuit shown in FIG. 1 or FIG. 2 so that all n-channel devices become p-channel devices and vice versa so that, for example, the n-channel power MOSFET of FIGS. 1 and 2 would be replaced by p-channel power MOSFET and the p-channel control transistor would be replaced by an n-channel control transistor.

In the embodiments described above, the main and current carrying sections of the power semiconductor switch are each separated into two subsidiary sections. However, the main and sense current carrying sections may each be separated into three or even more subsidiary sections. This may have particular advantage where the load voltage sensing circuit uses a comparator 70 because it would enable the load voltage Vbl to be ramped up in smaller steps. This would, of course, require a separate reference voltage and comparator for each of the additional main current carrying subsidiary sections so as to control switching in or out of those additional sections.

In the embodiments described above, each main current carrying section of the power semiconductor switch has its own sense current carrying section. However, it may be possible for the main current carrying sections to share a common sense current carrying section. This would, of course, require the measurement circuit to be able to compensate for the change in sense ratio when one of the main current carrying sections was switched off. Also, in the above-described embodiments where each main current carrying section has its own sense current carrying section, then the ratio of the number of cells in the sense current carrying section to the number of cells in the main current carrying section is the same for each main current carrying section. This, however, is not necessarily the case, although this would make interpretation of the measurement results more complicated.

From reading the present disclosure, other variations and modifications will be apparent to a person skilled in the art. Such variations and modifications may involve equivalent and other features which are already known in the design, manufacture and use of semiconductor devices and circuits using such devices and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

The applicants hereby give notice that new claims may be formulated to any such features and/or combinations of such features during the prosecution of the present application or of any further application derived therefrom.

What is claimed is:

1. A power switching circuit comprising: first and second voltage supply lines; a control signal input terminal; a load terminal for enabling a load to be coupled between the load terminal and the second voltage supply line; a measurement terminal for coupling to a current measurement circuit; a power semiconductor switch having a main current carrying section and a sense current carrying section for carrying a current which is proportional to and smaller than the current carried by the main current carrying section, the main and sense current carrying sections having a control electrode coupled to the control input terminal for controlling switching on and off of the power semiconductor switch and a first main electrode coupled to the first voltage supply line, the main current carrying section having a main current carrying electrode coupled to the load terminal and the sense current carrying section having a sense current carrying main electrode coupled to the measurement terminal, characterized by: at least the main current carrying section comprising a plurality of subsidiary current carrying sections, each subsidiary main current carrying section having a subsidiary main current carrying electrode coupled to the load terminal so that the subsidiary main current carrying electrodes together form the main current carrying electrode and each subsidiary main current carrying section having a respective different control electrode; and by control means for sensing the voltage at the load terminal and for separately controlling with control parameters the supply of a control signal from the control signal input to each of the control electrodes in dependence upon the sensed voltage, said control parameters being selected to cause a drop in resistance in said power switching circuit sufficient to place said circuit into its linear operating range if said circuit exceeds such linear operating range.

2. A circuit according to claim 1, wherein the power semiconductor switch is arranged to form a high-side switch with the first voltage supply line being coupled, in use, to a positive voltage and the control means is arranged to control the supply of the input control signal to the control electrodes so as to switch off one of the subsidiary main current carrying sections when the sensed voltage falls below a predetermined voltage.

3. A circuit according to claim 1, wherein the different ones of the plurality of main current carrying sections are arranged to carry different currents.

4. A circuit according to claim 1, wherein the sense current carrying section comprises a plurality of subsidiary sense current carrying sections with each subsidiary sense current carrying section being associated with and sharing the same control electrode as a corresponding one of the subsidiary main current carrying sections and each subsidiary sense current carrying section having a subsidiary sense current carrying electrode coupled to the measurement terminal so that the subsidiary sense current carrying electrodes together form the sense current carrying electrode.

5. A circuit according to claim 4, wherein the ratio between the current carrying capabilities of each of said subsidiary main current carrying sections and the corresponding subsidiary sense current carrying section is the same.

6. A circuit according to claim 1, further comprising a voltage impression means for impressing a voltage at the main current carrying electrode on the sense current carrying electrode.

7. A circuit according to claim 6, wherein the voltage impression means comprises a differential amplifier having an inverting and a non-inverting input and an output with the non-inverting input being coupled to the main current carrying electrode, the inverting input being coupled to the sense current carrying electrode and the output being coupled to the control electrode of a control transistor having first and second main electrodes coupling the main current path of the control transistor between the sense current carrying electrode and the measurement terminal.

8. A power switching circuit comprising: first and second voltage supply lines; a control signal input terminal; a load terminal for enabling a load to be coupled between the load terminal and the second voltage supply line; a measurement terminal for coupling to a current measurement circuit; a power semiconductor switch having a main current carrying section and a sense current carrying section for carrying a current which is proportional to and smaller than the current carried by the main current carrying section, the main and sense current carrying sections having a control electrode coupled to the control input terminal for controlling switching on and off of the power semiconductor switch and a first main electrode coupled to the first voltage supply line, the main current carrying section having a main current carrying electrode coupled to the load terminal and the sense current carrying section having a sense current carrying main electrode coupled to the measurement terminal, characterized by: at least the main current carrying section comprising a plurality of subsidiary current carrying sections, each subsidiary main current carrying section having a subsidiary main current carrying electrode coupled to the load terminal so that the subsidiary main current carrying electrodes together form the main current carrying electrode and each subsidiary main current carrying section having a respective different control electrode; and by control means for sensing the voltage at the load terminal and for separately controlling the supply of a control signal from the control signal input to each of the control electrodes in dependence upon the sensed voltage and comprising an amplifier having an inverting and a non-inverting input and an output with the non-inverting input being coupled to a reference voltage terminal for receiving a reference voltage, the inverting input being coupled to the sense current carrying electrode and the output being coupled to the control electrode of a control transistor having first and second main electrodes coupling the main current path of the control transistor between the control electrode and one of the subsidiary main current carrying electrodes such that, in use, when the voltage at the sense current carrying electrode reaches the reference voltage the control transistor is rendered conducting to reduce or turn off the input control signal to the associated control electrode.

9. A circuit according to claim 8, wherein the amplifier of the control means comprises a comparator and, in use, the control transistor of the control means causes said one of the subsidiary main current carrying sections to be turned off.

10. A circuit according to claim 8, wherein the amplifier of the control means comprises an operational amplifier and, in use, the control transistor of the control means causes the current flowing through said one of the subsidiary main current carrying sections to be reduced gradually.

11. A circuit according to claim 1, wherein the power semiconductor switch comprises a field effect device having a plurality of active cells sharing a common region coupled to the first main electrode with the main and sense current carrying sections having different numbers of active cells and the ratio between the number of active cells in the main and sense current carrying sections determining the ratio between the current carrying capabilities of the main and sense current carrying sections.

12. A circuit according to claim 11, wherein the power semiconductor switch comprises a power MOSFET or IGBT.

13. A circuit according to claim 1 in the form of an integrated circuit.

14. A power semiconductor device for use as the power semiconductor switch in a circuit in accordance with claim 1, the device comprising a semiconductor body having first and second opposed major surfaces with a regular array of active cells formed in the body and separated from one another by a control gate structure at the first major surface, each active cell comprising a source region of one conductivity type separated from a region common to the active cells and of the same conductivity type as the source regions by a body region defining adjacent the control gate structure a conduction channel area controllable by the control gate structure, the common region being coupled to a first main electrode, the active cells comprising a plurality of groups of active cells and the control gate structure comprising a plurality of subsidiary control gate structures each associated with a respective different one of said groups and each coupled to a respective different one of a plurality of control electrodes, each group of active cells comprising a first set of active cells forming a main current carrying section and having their source regions coupled to a main current carrying electrode on the first major surface and a second smaller set of active cells forming a sense current carrying section and having their source regions coupled to a sense current carrying electrode on the first major surface.

15. A device according to claim 14, wherein the control gate structure is provided in a trench extending into the semiconductor body from the first major surface.

16. A circuit according to claim 8, wherein the sense current carrying section comprises a plurality of subsidiary sense current carrying sections with each subsidiary sense current carrying section being associated with and sharing the same control electrode as a corresponding one of the subsidiary main current carrying sections and each subsidiary sense current carrying section having a subsidiary sense current carrying electrode coupled to the measurement terminal so that the subsidiary sense current carrying electrodes together form the sense current carrying electrode.

17. A circuit according to claim 8, further comprising a voltage impression means for impressing a voltage at the main current carrying electrode on the sense current carrying electrode.

18. A circuit according to claim 17, wherein the voltage impression means comprises a differential amplifier having an inverting and a non-inverting input and an output with the non-inverting input being coupled to the main current carrying electrode, the inverting input being coupled to the sense current carrying electrode and the output being coupled to the control electrode of a control transistor having first and second main electrodes coupling the main current path of the control transistor between the sense current carrying electrode and the measurement terminal.

19. A circuit according to claim 8, wherein the amplifier of the control means comprises an operational amplifier and, in use, the control transistor of the control means causes the current flowing through said one of the subsidiary main current carrying sections to be reduced gradually.

20. A power semiconductor device for use as the power semiconductor switch in a circuit in accordance with claim 8, the device comprising a semiconductor body having first and second opposed major surfaces with a regular array of active cells formed in the body and separated from one another by a control gate structure at the first major surface, each active cell comprising a source region of one conductivity type separated from a region common to the active cells and of the same conductivity type as the source regions by a body region defining adjacent the control gate structure a conduction channel area controllable by the control gate structure, the common region being coupled to a first main electrode, the active cells comprising a plurality of groups of active cells and the control gate structure comprising a plurality of subsidiary control gate structures each associated with a respective different one of said groups and each coupled to a respective different one of a plurality of control electrodes, each group of active cells comprising a first set of active cells forming a main current carrying section and having their source regions coupled to a main current carrying electrode on the first major surface and a second smaller set of active cells forming a sense current carrying section and having their source regions coupled to a sense current carrying electrode on the first major surface.

* * * * *